US012700888B2

(12) United States Patent
Chen et al.

(10) Patent No.: US 12,700,888 B2
(45) Date of Patent: Aug. 4, 2026

(54) METHOD FOR PERFORMING ANTENNA TUNING CONTROL OF WIRELESS TRANSCEIVER DEVICE IN WIRELESS COMMUNICATIONS SYSTEM, AND ASSOCIATED APPARATUS

(71) Applicant: MEDIATEK INC., Hsin-Chu (TW)

(72) Inventors: Yen-Liang Chen, Hsinchu City (TW); Chun-Hsiang Chen, Hsinchu City (TW); Po-Chung Hsiao, Hsinchu City (TW); Kuo-Hao Chen, Hsinchu City (TW)

(73) Assignee: MEDIATEK INC., Hsinchu City (TW)

(*) Notice: Subject to any disclaimer, the term of this patent is extended or adjusted under 35 U.S.C. 154(b) by 340 days.

(21) Appl. No.: 18/533,230

(22) Filed: Dec. 8, 2023

(65) Prior Publication Data

US 2024/0195451 A1 Jun. 13, 2024

Related U.S. Application Data

(60) Provisional application No. 63/386,512, filed on Dec. 8, 2022.

(51) Int. Cl.
| | |
|---|---|
| *H04B 1/40* | (2015.01) |
| *H01Q 1/24* | (2006.01) |
| *H03J 5/02* | (2006.01) |

(52) U.S. Cl.
CPC .............. *H04B 1/40* (2013.01); *H01Q 1/243* (2013.01); *H03J 5/02* (2013.01)

(58) Field of Classification Search
CPC ........... H01Q 1/50; H01Q 5/314; H01Q 1/22; H01Q 23/00; H04B 17/102; H04B 17/12; H04B 17/103; H04B 17/18; H04B 17/19
See application file for complete search history.

(56) References Cited

U.S. PATENT DOCUMENTS

| | | | | |
|---|---|---|---|---|
| 11,211,698 B2 * | 12/2021 | Shi | ........................ | H04B 17/102 |
| 2014/0227981 A1 * | 8/2014 | Pecen | .................. | H04B 1/0458 |
| | | | | 455/77 |
| 2022/0052743 A1 * | 2/2022 | Cha | ........................ | H01Q 3/2605 |
| 2025/0316901 A1 * | 10/2025 | Apaydin | ................ | H01Q 5/335 |

* cited by examiner

*Primary Examiner* — Curtis A Kuntz
(74) *Attorney, Agent, or Firm* — Winston Hsu

(57) ABSTRACT

A method for performing antenna tuning control of a wireless transceiver device in a wireless communications system and associated apparatus are provided. The method may include: during a tuning stage among multiple stages, utilizing a communications control circuit within the wireless transceiver device to obtain predetermined characterization data of at least one impedance-related tuning component regarding antenna tuning of at least one antenna from a storage device within the wireless transceiver device, where the at least one impedance-related tuning component includes at least one aperture tuner (APT); during the tuning stage, utilizing the communications control circuit to measure voltage standing wave ratio(s) (VSWR(s)) of any antenna among the at least one antenna; and during the tuning stage, utilizing the communications control circuit to determine at least one setting of the at least one impedance-related tuning component according to the predetermined characterization data and the measured VSWR(s), for antenna performance optimization.

10 Claims, 9 Drawing Sheets

IMT

511

$C_2$ $L_1$ $L_2$ $L_3$ $C_1$

APT

512

$L_6$ $C_6$ $L_7$

METHOD FOR PERFORMING ANTENNA TUNING CONTROL OF WIRELESS TRANSCEIVER DEVICE IN WIRELESS COMMUNICATIONS SYSTEM, AND ASSOCIATED APPARATUS

CROSS REFERENCE TO RELATED APPLICATIONS

This application claims the benefit of U.S. Provisional Application No. 63/386,512, filed on Dec. 8, 2022. The content of the application is incorporated herein by reference.

BACKGROUND

The present invention is related to communications control, and more particularly, to a method for performing antenna tuning control of a wireless transceiver device in a wireless communications system, and associated apparatus such as the wireless transceiver device.

According to the related art, a wireless communications device in a telecommunication system (e.g., 4G or 5G systems) may be arranged to send or receive data wirelessly, through one or more antennas thereof, in order to provide one or more services to the user of the wireless communications device. Some problems such as reduced antenna performance, degraded antenna efficiency, etc. may occur. For example, the antenna performance may vary with respect to external conditions and user scenarios, and more particularly, may be reduced due to hand or head blocking and/or being close to certain materials. In addition, the antenna efficiency may vary with respect to bandwidth (BW) settings and size-related limitations, and more particularly, may be degraded due to a larger BW (for example, with more bands per antenna) and/or a smaller size (for example, with more antennas per device). It seems that no proper suggestion has been proposed in the related art. Thus, a novel method and associated architecture are needed for solving the problems without introducing any side effect or in a way that is less likely to introduce a side effect.

SUMMARY

It is an objective of the present invention to provide a method for performing antenna tuning control of a wireless transceiver device in a wireless communications system, and associated apparatus such as the wireless transceiver device (e.g., a multifunctional mobile phone), in order to solve the above-mentioned problems.

At least one embodiment of the present invention provides a method for performing antenna tuning control of a wireless transceiver device in a wireless communications system. The method may comprise: during a tuning stage among multiple stages, utilizing a communications control circuit within the wireless transceiver device to obtain predetermined characterization data of at least one impedance-related tuning component regarding antenna tuning of at least one antenna from a storage device within the wireless transceiver device, wherein the at least one impedance-related tuning component comprises at least one aperture tuner (APT), and the predetermined characterization data is determined in advance during a characterization stage among the multiple stages; during the tuning stage, utilizing the communications control circuit to measure at least one voltage standing wave ratio (VSWR) of any antenna among the at least one antenna; and during the tuning stage, utilizing the communications control circuit to determine at least one setting of the at least one impedance-related tuning component according to the predetermined characterization data and the measured VSWR(s), for antenna performance optimization.

At least one embodiment of the present invention provides a wireless transceiver device for performing antenna tuning control of the wireless transceiver device in a wireless communications system, where the wireless transceiver device may be one of multiple devices within the wireless communications system. The wireless transceiver device may comprise a processing circuit that is arranged to control operations of the wireless transceiver device. The wireless transceiver device may further comprise at least one communications control circuit that is coupled to the processing circuit and arranged to perform communications control, where the aforementioned at least one communications control circuit is arranged to perform wireless communications operations with a network within the wireless communications system for the wireless transceiver device. For example, during a tuning stage among multiple stages, the wireless transceiver device is arranged to utilize the at least one communications control circuit to obtain predetermined characterization data of at least one impedance-related tuning component regarding antenna tuning of at least one antenna from a storage device within the wireless transceiver device, wherein the at least one impedance-related tuning component comprises at least one APT, and the predetermined characterization data is determined in advance during a characterization stage among the multiple stages; during the tuning stage, the wireless transceiver device is arranged to utilize the at least one communications control circuit to measure at least one VSWR of any antenna among the at least one antenna; and during the tuning stage, the wireless transceiver device is arranged to utilize the at least one communications control circuit to determine at least one setting of the at least one impedance-related tuning component according to the predetermined characterization data and the measured VSWR(s), for antenna performance optimization.

It is an advantage of the present invention that, through proper design, the present invention method, as well as the associated apparatus such as the wireless transceiver device (e.g., the multifunctional mobile phone), can adaptively perform antenna tuning with joint consideration of different types of impedance-related tuning components (e.g., at least one APT and at least one impedance tuner (IMT)), and more particularly, perform closed-loop antenna tuning (CLAT) with joint optimization of APT and IMT settings, in order to improve antenna efficiency and therefore improve the system performance, where at least the APT hardware (HW) may be included before the calibration plane (or the connection point of an Open/Short/Load (OSL) calibration kit), for being processed with the CLAT, to make the calibration plane be closer to the antenna. Additionally, the present invention method and apparatus can solve the related art problems without introducing any side effect or in a way that is less likely to introduce a side effect.

These and other objectives of the present invention will no doubt become obvious to those of ordinary skill in the art after reading the following detailed description of the preferred embodiment that is illustrated in the various figures and drawings.

3

Figure 2:
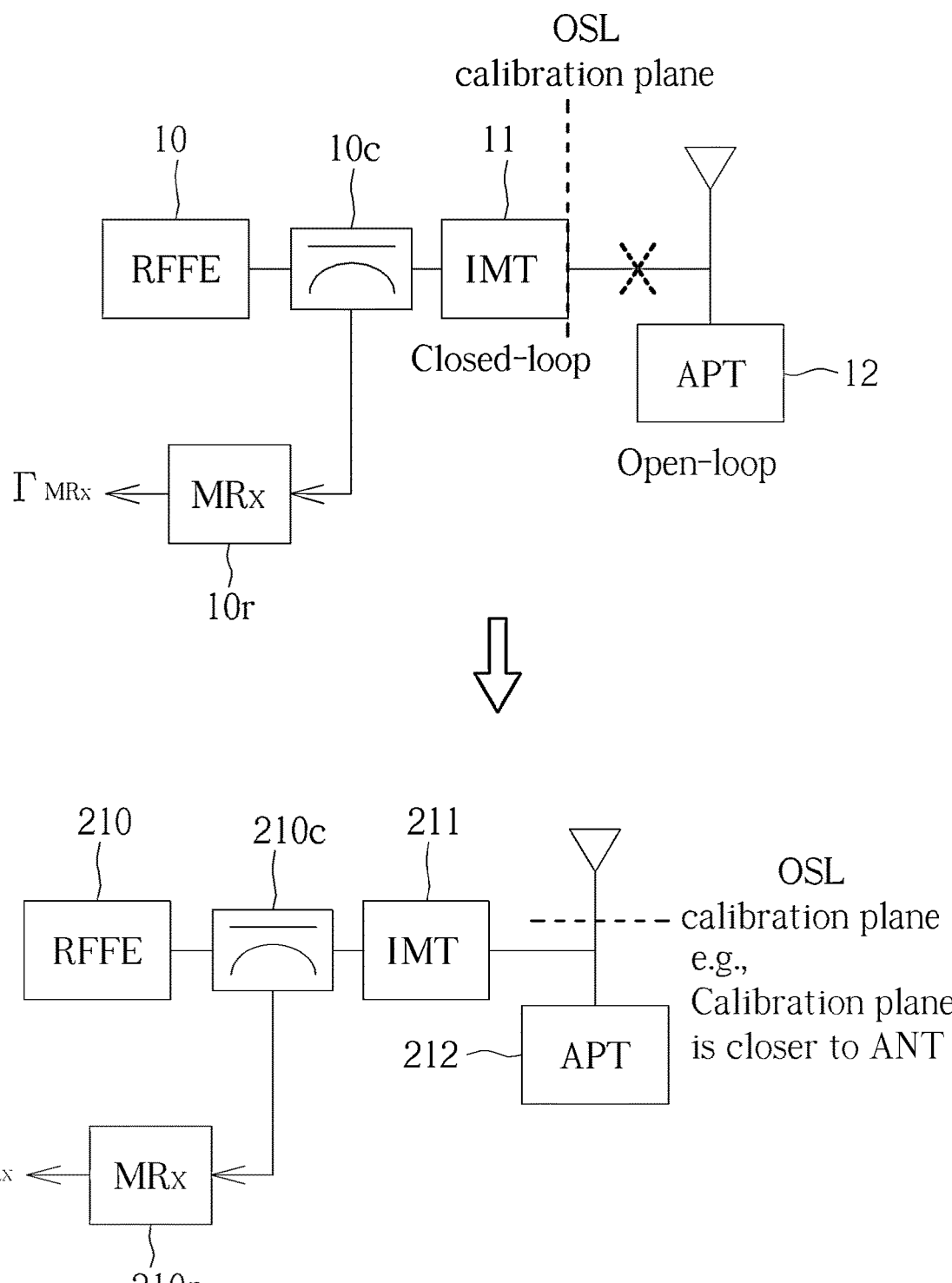

FIG. 2 illustrates, in the lower half part thereof, a first APT-HW-included calibration control scheme of a method for performing antenna tuning control of a wireless transceiver device in a wireless communications system according to an embodiment of the present invention, where a non-APT-HW-included calibration control scheme involved with open-loop tuning may be illustrated in the upper half part of FIG. 2 for better comprehension.

Figure 3:
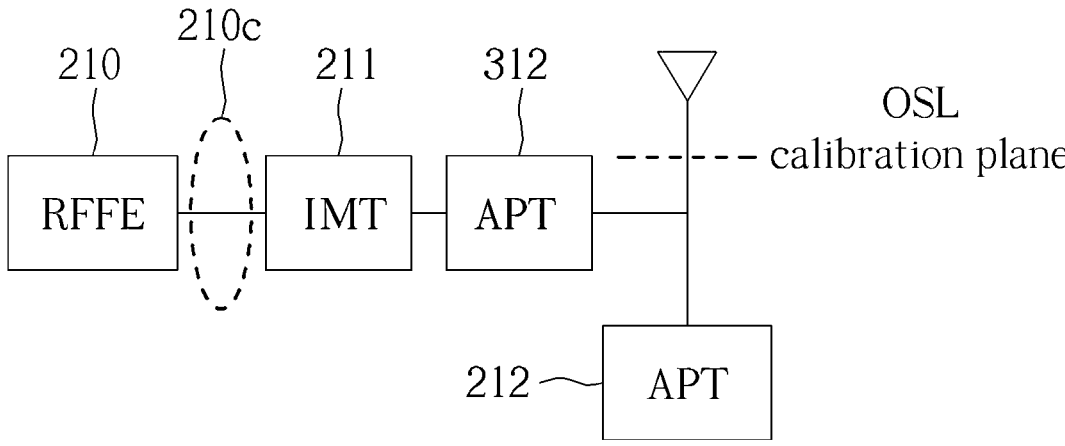

FIG. 3 illustrates a second APT-HW-included calibration control scheme of the method according to an embodiment of the present invention.

Figure 4:
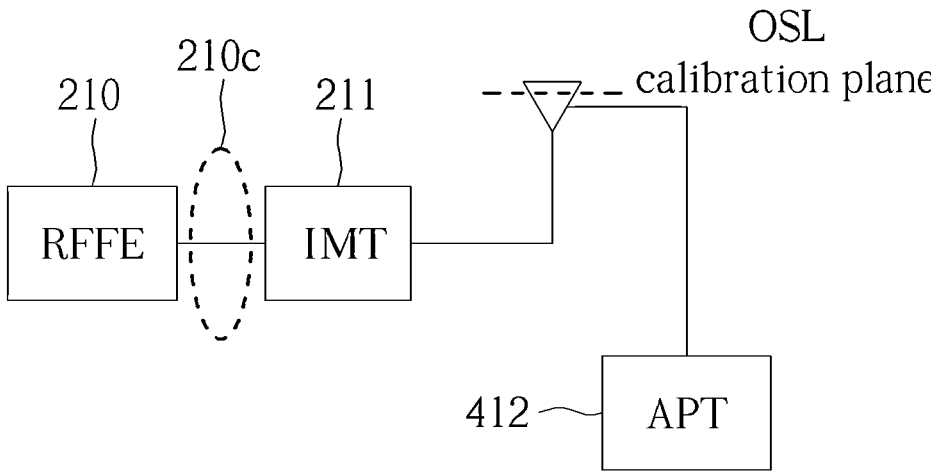

FIG. 4 illustrates a third APT-HW-included calibration control scheme of the method according to an embodiment of the present invention.

Figure 5:
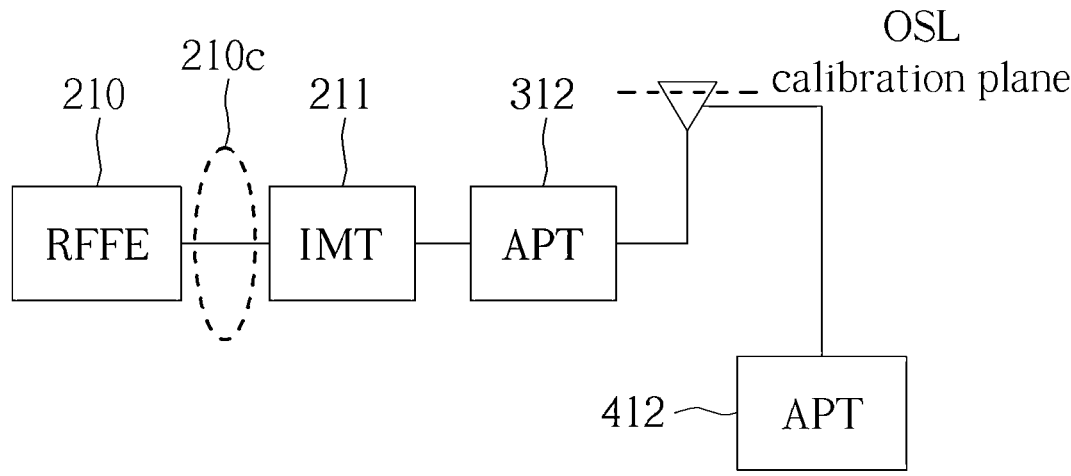

FIG. 5 illustrates a fourth APT-HW-included calibration control scheme of the method according to an embodiment of the present invention.

Figure 6:
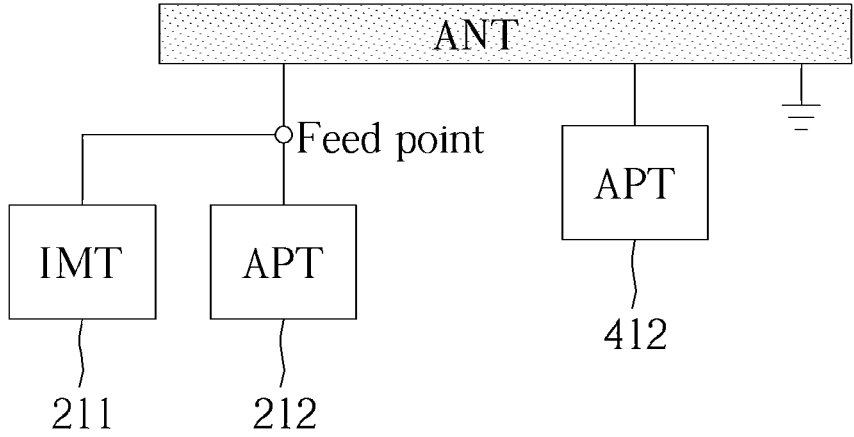

FIG. 6 illustrates some implementation details of the connections between an antenna and some components according to an embodiment of the present invention.

Figure 7:
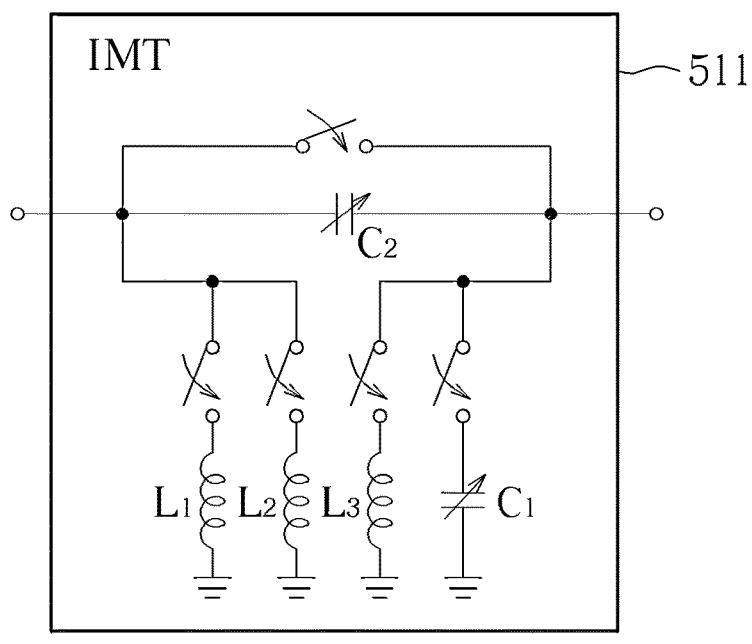

FIG. 7 illustrates some implementation details of an IMT according to an embodiment of the present invention.

Figure 8:
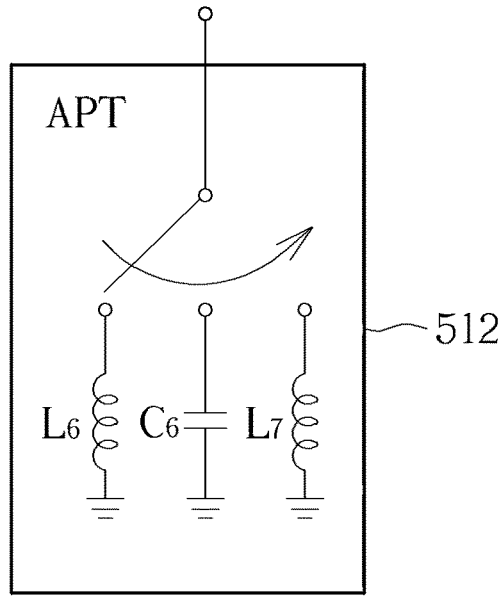

FIG. 8 illustrates some implementation details of an APT according to an embodiment of the present invention.

Figure 9:
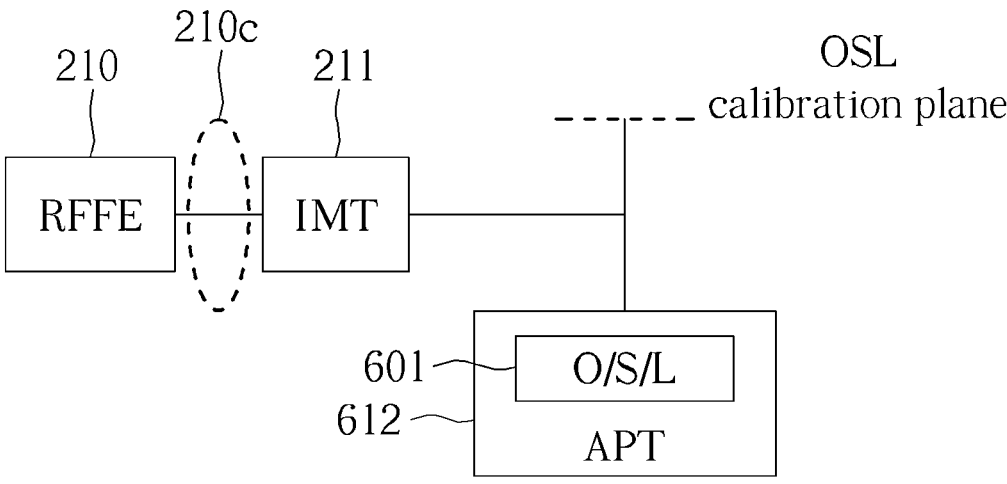

FIG. 9 illustrates an internal-calibration-kit-based control scheme of the method according to an embodiment of the present invention.

Figure 10:
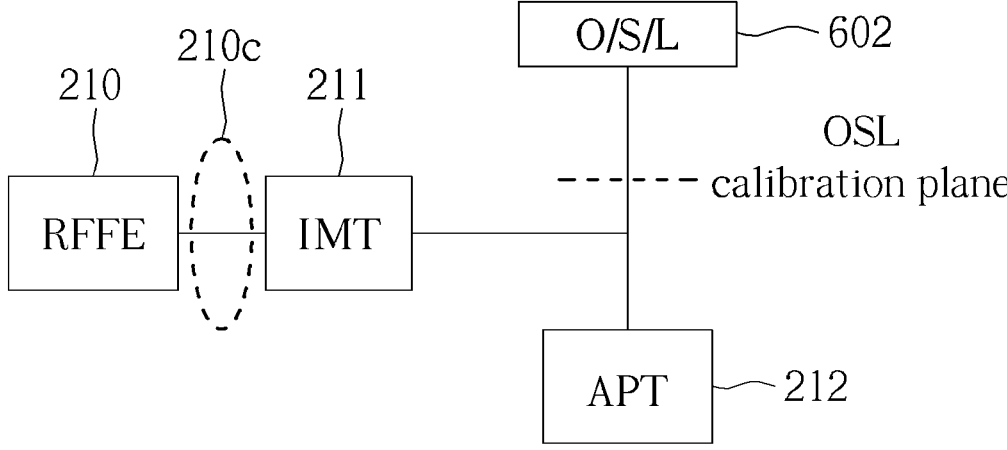

FIG. 10 illustrates an external-calibration-kit-based control scheme of the method according to an embodiment of the present invention.

Figure 11:
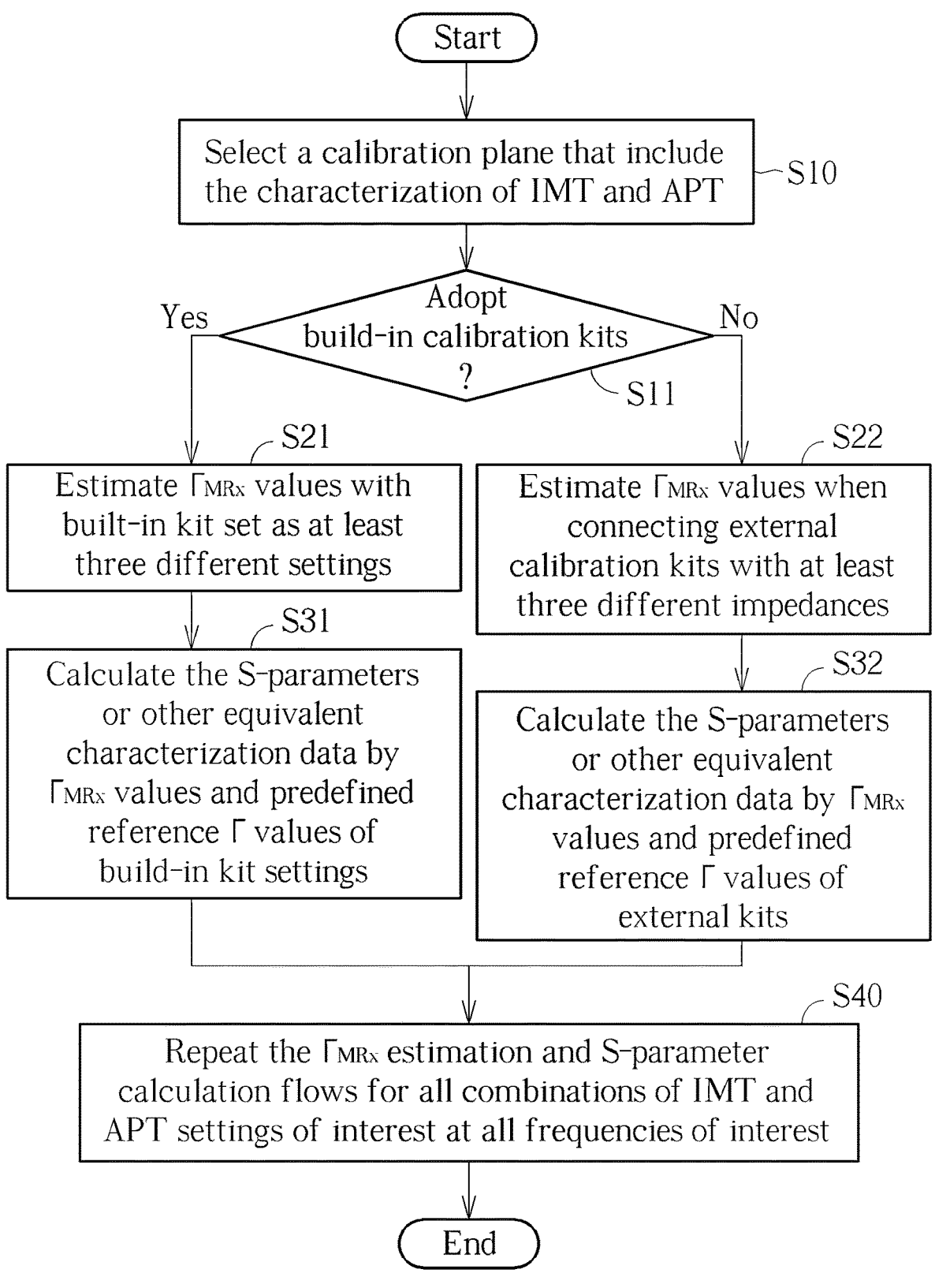

FIG. 11 illustrates a working flow of the method regarding a characterization stage according to an embodiment of the present invention.

Figure 12:
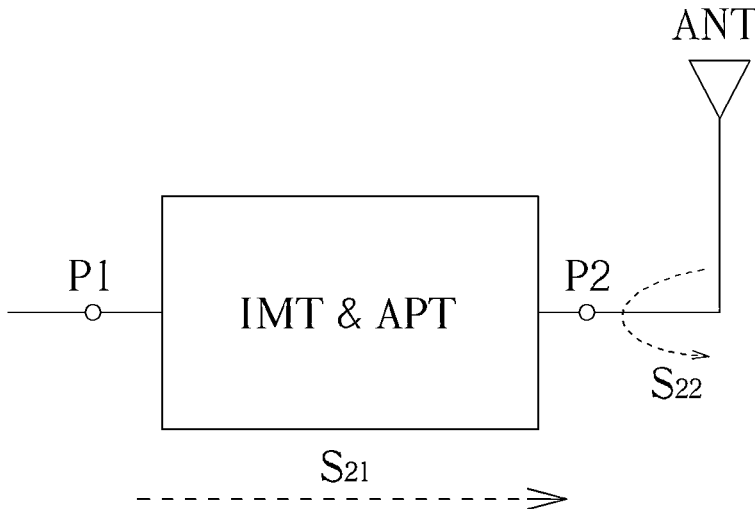

FIG. 12 illustrates an estimation control scheme of the method according to an embodiment of the present invention.

Figure 13:
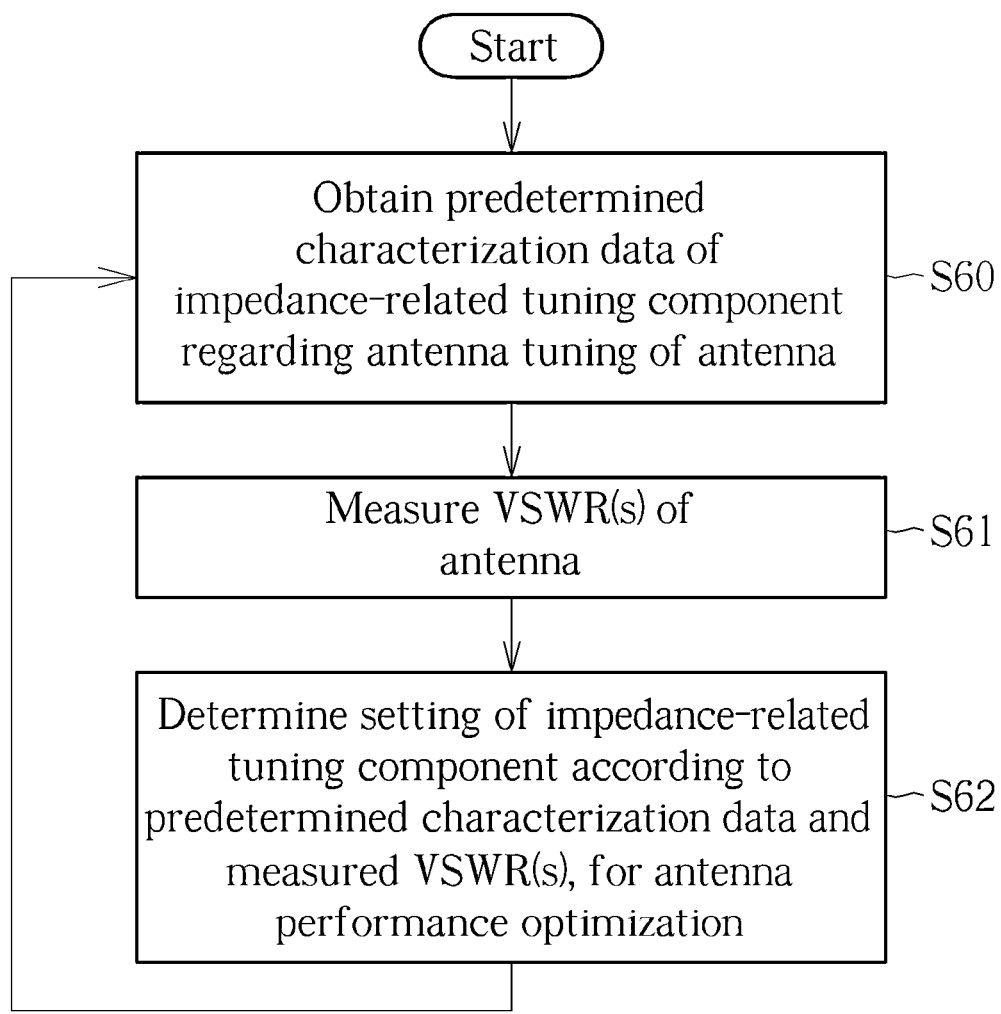

FIG. 13 illustrates a working flow of the method regarding a tuning stage according to an embodiment of the present invention.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
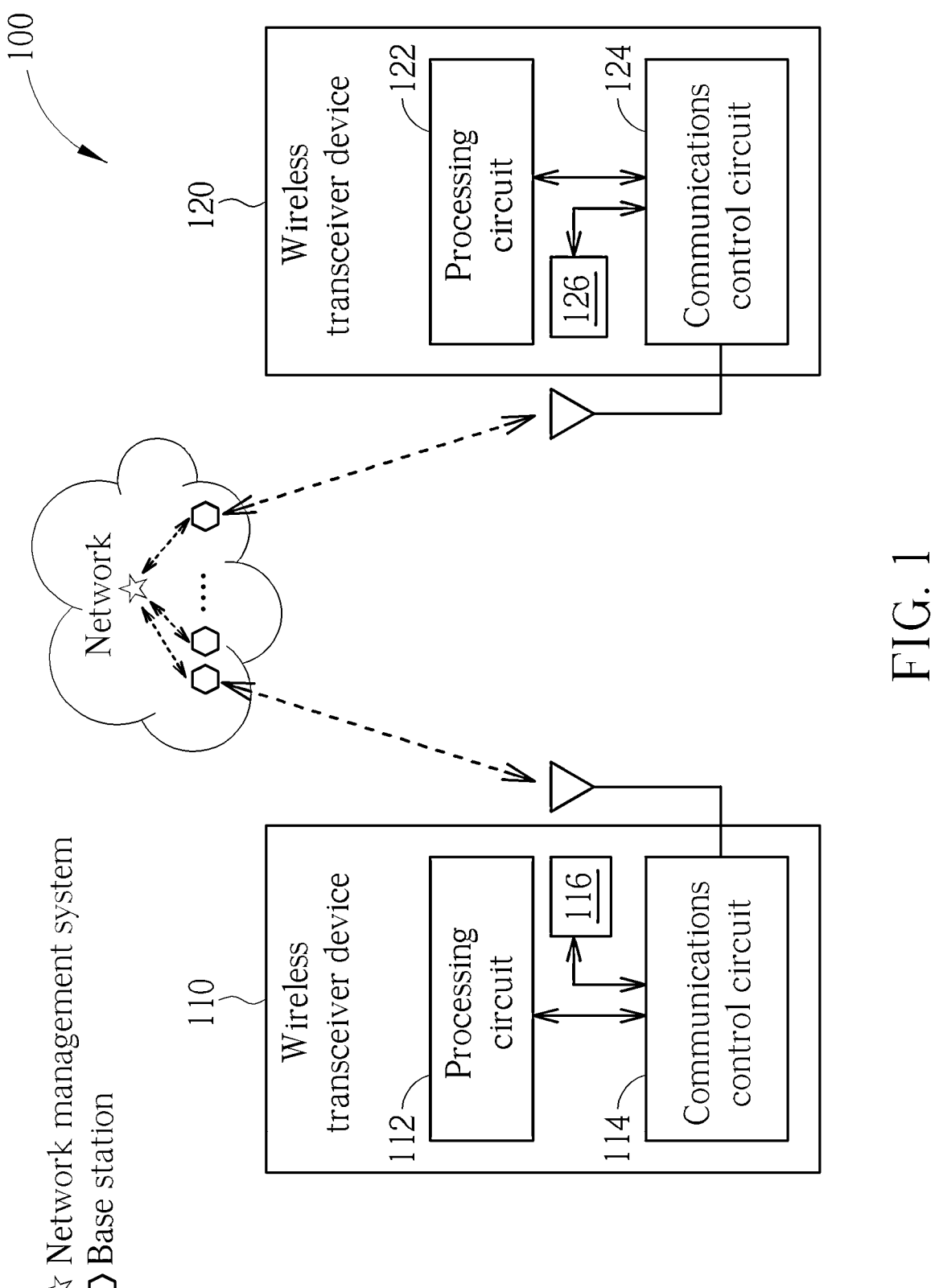
FIG. 1 is a diagram of a wireless communications system according to an embodiment of the present invention.

FIG. 1 is a diagram of a wireless communications system 100 according to an embodiment of the present invention. For better comprehension, the wireless communications system 100, as well as any wireless transceiver device among multiple wireless transceiver devices #1, . . . and #N therein, may be compatible or back-compatible to one or more versions of predetermined wireless telecommunications standards, and more particularly, the wireless communications system 100 may comprise a network such as that of any system among the third generation (3G) system, the fourth generation (4G) system, the fifth generation (5G) system, etc., where "N" may represent a positive integer that is greater than one, but the present invention is not limited thereto. For example, the network may comprise a network management system for managing the network, and comprise multiple base stations for facilitating wireless communications between user equipment (UE) and the network, and the multiple base stations may be implemented by way of base transceiver station (BTS), Node B, evolved Node B (eNB), gNodeB (gNB), etc. Regarding the multiple wireless transceiver devices #1, . . . and #N within the wireless communications system 100, a wireless transceiver device 110 may represent the wireless transceiver device #1, a wireless transceiver device 120 may represent the wireless transceiver device #2, and the rest may be deduced by analogy. As shown in FIG. 1, the wireless transceiver device 110 may comprise a processing circuit 112, at least one communications control circuit (e.g., one or more communications control circuits), which may be collectively referred to as the communications control circuit 114, at least one antenna (e.g., one or more antennas) of the communications control circuit 114, and a storage device 116, and the wireless transceiver device 120 may comprise a processing circuit 122, at least one communications control circuit (e.g., one or more communications control circuits), which may be collectively referred to as the communications control circuit 124, at least one antenna (e.g., one or more antennas) of the communications control circuit 124, and a storage device 126.

In the architecture shown in FIG. 1, the processing circuit 112 can be arranged to control operations of the wireless transceiver device 110, and the communications control circuit 114 can be arranged to perform communications control, and more particularly, perform wireless communications operations with the network (or the base stations thereof) for the wireless transceiver device 110. For example, the storage device 116 can be arranged to store information, and can be coupled to the communications control circuit 114 to allow the communications control circuit 114 to access (e.g., read or write) the storage device 116, but the present invention is not limited thereto. The storage device 116 can be coupled to the processing circuit 112 for being accessed by the processing circuit 112 and storing information under control of the processing circuit 112. In addition, the processing circuit 122 can be arranged to control operations of the wireless transceiver device 120, and the communications control circuit 124 can be arranged to perform communications control, and more particularly, perform wireless communications operations with the network (or the base stations thereof) for the wireless transceiver device 120. For example, the storage device 126 can be arranged to store information, and can be coupled to the communications control circuit 124 to allow the communications control circuit 124 to access (e.g., read or write) the storage device 126, but the present invention is not limited thereto. The storage device 126 can be coupled to the processing circuit 122 for being accessed by the processing circuit 122 and storing information under control of the processing circuit 122.

According to some embodiments, the processing circuits 112 and 122 can be implemented by way of at least one processor/microprocessor, at least one random access memory (RAM), at least one bus, etc., the communications control circuits 114 and 124 can be implemented by way of at least one wireless network control circuit, and the storage devices 116 and 126 can be implemented by way of at least one non-volatile memory such as at least one electrically erasable programmable read-only memory (EEPROM), at least one Flash memory, etc., but the present invention is not limited thereto. Examples of the wireless transceiver devices 110 and 120 may include, but are not limited to: a multifunctional mobile phone, a laptop computer, an all-in-one computer and a wearable device.

The wireless communications system 100 as well as the aforementioned any wireless transceiver device among the multiple wireless transceiver devices #1, . . . and #N therein may be compatible or back-compatible to the one or more versions of the predetermined wireless telecommunications standards such as the 3G standards, the 4G standards, the 5G standards, etc., but the present invention is not limited thereto. For example, the wireless communications system 100 as well as the aforementioned any wireless transceiver device among the multiple wireless transceiver devices #1, . . . and #N may be compatible or back-compatible to one or more versions of the 3rd Generation Partnership Project (3GPP) standards. According to some embodiments, the network and/or the multiple wireless transceiver devices #1, . . . and #N may vary, and/or the one or more versions of the predetermined wireless telecommunications standards may be replaced by one or more versions of predetermined communications standards, or may be replaced by any combination of the one or more versions of the predetermined wireless telecommunications standards and the one or more versions of the predetermined communications standards. For example, the aforementioned any wireless transceiver device among the multiple wireless transceiver devices #1, . . . and #N, such as the wireless transceiver devices 110 and 120, may be compatible or back-compatible to one or more versions of the Institute of Electrical and Electronics Engineers (IEEE) 802.11 standards. In some examples, the aforementioned any wireless transceiver device among the multiple wireless transceiver devices #1, . . . and #N, such as the wireless transceiver devices 110 and 120, may be compatible or back-compatible to one or more versions of some other standards such as that of Worldwide Interoperability for Microwave Access (WiMAX) or other wide area network (WAN) technology. In some examples, the aforementioned any wireless transceiver device among the multiple wireless transceiver devices #1, . . . and #N, such as the wireless transceiver devices 110 and 120, may be compatible or back-compatible to one or more versions of wireless local area network (WLAN)—related standards using one or more radio access technologies such as the Long Term Evolution (LTE) technology, the New Radio (NR) technology, etc.

FIG. 2 illustrates, in the lower half part thereof, a first APT-HW-included calibration control scheme of a method for performing antenna tuning control of a wireless transceiver device in a wireless communications system according to an embodiment of the present invention, where a non-APT-HW-included (or APT-HW-not-included) calibration control scheme involved with open-loop tuning may be illustrated in the upper half part of FIG. 2 for better comprehension. The method is applicable to the aforementioned any wireless transceiver device among the multiple wireless transceiver devices #1, . . . and #N within the wireless communications system 100 shown in FIG. 1, such as the wireless transceiver devices 110 and 120. Taking the wireless transceiver device 110 as an example, the associated operations may comprise:

(1) during a tuning stage among multiple stages, the wireless transceiver device 110 may utilize the communications control circuit 114 within the wireless transceiver device 110 to obtain predetermined characterization data of at least one impedance-related tuning component regarding antenna tuning of the aforementioned at least one antenna of the communications control circuit 114 from the storage device 116 within the wireless transceiver device 110;

(2) during the tuning stage, the wireless transceiver device 110 may utilize the communications control circuit 114 to measure at least one VSWR (e.g., one or more VSWRs) of any antenna among the aforementioned at least one antenna of the communications control circuit 114; and (3) during the tuning stage, the wireless transceiver device 110 may utilize the communications control circuit 114 to determine at least one setting of the aforementioned at least one impedance-related tuning component according to the predetermined characterization data and the measured VSWR(s), for antenna performance optimization;

where the predetermined characterization data may be determined in advance during a characterization stage among the multiple stages, but the present invention is not limited thereto. The aforementioned at least one impedance-related tuning component may comprise different types of impedance-related tuning components, such as a first type (Type #1) and a second type (Type #2) among the aforementioned different types of impedance-related tuning components. For example, the aforementioned at least one impedance-related tuning component may comprise:

(Type #1) at least one APT (e.g., one or more APTs) belonging to the first type, for performing aperture tuning with the aid of the selection among various settings of internal components (e.g., one or more inductors, one or more capacitors, and/or one or more switches) thereof to make the resonance frequency of the antenna be changed and therefore improve the antenna efficiency at a frequency of interest; and (Type #2) at least one IMT (e.g., one or more IMTs) belonging to the second type, for performing impedance tuning with the aid of the selection among various settings of internal components (e.g., one or more inductors, one or more capacitors, and/or one or more switches) thereof to make the respective equivalent impedances on two sides of a certain observation location on the signal path match with each other in order to minimize the signal reflection.

As each IMT among the aforementioned at least one IMT (or "the IMT(s)" for brevity) may have multiple selectable IMT settings corresponding to multiple candidate IMT states of the aforementioned each IMT, the IMT settings of the IMT(s) within the communications control circuit 114 may comprise multiple predetermined IMT settings such as I IMT settings {IMT_setting(i)|i=1, . . . , I} corresponding to I candidate states of the IMT(s), where the IMT setting count I of the I IMT settings {IMT_setting(i)|i=1, . . . , I} may be an integer that is greater than one. As each APT among the aforementioned at least one APT (or "the APT(s)" for brevity) may have multiple selectable APT settings corresponding to multiple candidate APT states of the aforementioned each APT, the APT settings of the APT(s) within the communications control circuit 114 may comprise multiple predetermined APT settings such as J APT settings {APT_setting(j)|j=1, . . . , J} corresponding to J candidate states of the APT(s), where the APT setting count J of the J APT settings {APT_setting(j)|j=1, . . . , J} may be an integer that is greater than one. As a result, there may be (I*J) combinations of the I IMT settings {IMT_setting(i)|i= 1, . . . , I} and the J APT settings {APT_setting(j)|j=

1, . . . , J}. For example, when I=100 and J=18, there may be (100*18) combinations of the IMT settings {IMT_setting (i)|i=1, . . . , 100} and the APT settings {APT_setting(j)|j=1, . . . , 18}, such as 1800 combinations, but the present invention is not limited thereto. In some examples, the IMT setting count I and/or the APT setting count J may vary. In addition, during the characterization stage, the communications control circuit 114 may be arranged to determine the predetermined characterization data according to a calibration flow for the CLAT with joint characterization of the aforementioned different types of impedance-related tuning components (e.g., the aforementioned at least one APT and the aforementioned at least one IMT). More particularly, during the characterization stage, the communications control circuit 114 may execute the calibration flow to perform hardware characterization on the aforementioned at least one impedance-related tuning component such as the aforementioned different types of impedance-related tuning components (e.g., the aforementioned at least one APT and the aforementioned at least one IMT), in order to determine the predetermined characterization data, for being used in the tuning stage. For example, the calibration flow may be executed under control of the processing circuit 112 running a manufacturing tool program or under control of a manufacturing tool device coupled to the wireless transceiver device 110, but the present invention is not limited thereto. Additionally, any impedance-related tuning component among the aforementioned at least one impedance-related tuning component, such as a first APT among the aforementioned at least one APT, may comprise a built-in calibration kit (e.g., an OSL calibration kit) for providing reference impedances regarding open, short and load settings (e.g., an open setting, a short setting, and one or more load settings), respectively. During the tuning stage, the communications control circuit 114 may perform antenna tuning (e.g., aperture tuning and/or impedance tuning) according to the reference impedances provided by the aforementioned any impedance-related tuning component (e.g., the first APT).

For better comprehension, assume that one or more functions of the wireless transceiver device 110 may be temporarily disabled to allow the wireless transceiver device 110 (or the communications control circuit 114 therein) to operate according to the non-APT-HW-included calibration control scheme shown in the upper half part of FIG. 2, and the communications control circuit 114 may comprise a radio frequency frontend (RFFE) 10, a coupler 10c, a measurement receiver (MRx) 10r, an IMT 11 and an APT 12, and more particularly, may perform the impedance tuning of the IMT 11 and the aperture tuning of the APT 12 in a closed-loop manner and an open-loop manner, respectively, where the CLAT may be performed only for the IMT 11, but the present invention is not limited thereto. Based on the non-APT-HW-included calibration control scheme, the OSL calibration may be performed only for the IMT 11, for example, according to the following equation:

$$\begin{bmatrix} \Gamma_{L1} & 1 & -\Gamma_{MRx1}\Gamma_{L1} \\ \Gamma_{L2} & 1 & -\Gamma_{MRx2}\Gamma_{L2} \\ \Gamma_{L3} & 1 & -\Gamma_{MRx3}\Gamma_{L3} \end{bmatrix} \begin{bmatrix} a \\ b \\ c \end{bmatrix} = \begin{bmatrix} \Gamma_{MRx1} \\ \Gamma_{MRx2} \\ \Gamma_{MKr3} \end{bmatrix}; \qquad \text{Eq (1)}$$

where the OSL calibration plane (or the connection point of a simple OSL calibration kit) may be at the IMT output such as the output terminal of the IMT 11, and the symbol "X" depicted with dashed lines may indicate the temporary disconnection at the OSL calibration plane, for temporarily connecting the simple OSL calibration kit to the OSL calibration plane. In addition, the communications control circuit 114 may be arranged to perform the CLAT operations at runtime, to find the best setting for the IMT 11 based on the OSL calibration data and the MRx-measured impedance parameters {Gamma_MRx} (or the MRx-measured impedance parameters {$\Gamma_{MRx}$} such as the MRx-measured impedance parameters $\Gamma_{MRx1}$, $\Gamma_{MRx2}$ and $\Gamma_{MRx3}$ in Equation Eq(1) shown above), and the IMT setting of the IMT 11 may only have lower degree of freedom to match the load impedance $\Gamma_L$ of the combination "(ANT+APT)" of the antenna (ANT) and the APT 12.

In Equation Eq(1), the reflection coefficients $\Gamma_{L1}$, $\Gamma_{L2}$ and $\Gamma_{L3}$ may represent the reference impedances (which may be known values) of the simple OSL calibration kit with an open setting, a short setting and a load setting, respectively, the MRx-measured impedance parameters {$\Gamma_{MRx1}$, $\Gamma_{MRx2}$, $\Gamma_{MRx3}$} may represent the measured impedances that are measured by the MRx 10r, and the characterization values {a, b, c} in Equation Eq(1) may represent the values to be determined according to Equation Eq(1), for being used by the communications control circuit 114 at runtime when performing antenna tuning. During performing the antenna tuning, the communications control circuit 114 may determine the load impedance $F_L$ according to the following equation:

$$(a*\Gamma_L) + (b*1) - (c*\Gamma_{MRx}*\Gamma_L) = \Gamma_{MRx};$$

where the characterization values {a, b, c} in the above equation may be dependent upon the IMT setting IMT_setting(i), and therefore may be rewritten as the characterization values {a(i), b(i), c(i)}. For example, assuming that I=100, the communications control circuit 114 may have obtained 100 sets of characterization data (e.g., the characterization values {{a(i), b(i), c(i)} |i=1, . . . , 100}, and may determine the load impedance according to the above equation at runtime, in order to determine the best setting according to the load impedance.

As shown in the lower half part of FIG. 2, the wireless transceiver device 110 (or the communications control circuit 114 therein) may operate according to the first APT-HW-included calibration control scheme to achieve a better overall performance, and the communications control circuit 114 may comprise an RFFE 210, a coupler 210c, an MRx 210r, an IMT 211 and an APT 212, and more particularly, may perform the impedance tuning of the IMT 211 and the aperture tuning of the APT 212 in the closed-loop manner, where the CLAT may be performed for all of the IMT 211 and the APT 212. Based on the first APT-HW-included calibration control scheme, all of the APT(s) such as the APT 212 in addition to all of the IMT(s) such as the IMT 211 may be included in the impedance-related tuning components to be processed with the OSL calibration, and the OSL calibration may be performed for the IMT 211 and the APT 212, for example, according to the following equation:

$$\begin{bmatrix} \Gamma_{L1} & 1 & -\Gamma_{MRx1}\Gamma_{L1} \\ \Gamma_{L2} & 1 & -\Gamma_{MRx2}\Gamma_{L2} \\ \vdots & \vdots & \vdots \\ \Gamma_{L16} & 1 & -\Gamma_{MRx16}\Gamma_{L16} \end{bmatrix} \begin{bmatrix} a \\ b \\ c \end{bmatrix} = \begin{bmatrix} \Gamma_{MRx1} \\ \Gamma_{MRx2} \\ \vdots \\ \Gamma_{MRx16} \end{bmatrix}; \qquad \text{Eq (2)}$$

where the OSL calibration plane (or the connection point of a predetermined OSL calibration kit) may be closer to the antenna (ANT), and the APT settings of the APT(s) can be utilized for the OSL calibration. In addition, the communications control circuit 114 may be arranged to perform the CLAT operations, to jointly find the best setting for the IMT 211 and the APT 212 based on the OSL calibration data and the MRx-measured impedance parameters {Gamma_MRx} (or the MRx-measured impedance parameters {$\Gamma_{MRx}$} such as the MRx-measured impedance parameters $\Gamma_{MRx1}$, $\Gamma_{MRx2}$ . . . and $\Gamma_{MRx16}$ in Equation Eq(2) shown above), and the combination "(IMT+APT)" of the IMT 211 and the APT 212 may give higher degree of freedom to match the load impedance such as that of the antenna (ANT).

In Equation Eq(2), the reflection coefficients $\Gamma_{L1}$, $\Gamma_{L2}$ . . . and $\Gamma_{L16}$ may represent the reference impedances (which may be known values) of the predetermined OSL calibration kit with a predetermined open setting, a predetermined short setting and (16-2) other settings (e.g., a first load setting and (16-3) additional load settings), respectively, the MRx-measured impedance parameters {$\Gamma_{MRx1}$, $\Gamma_{MRx2}$, . . . , $\Gamma_{MRx16}$} may represent the measured impedances that are measured by the MRx 210r, and the characterization values {a, b, c} in Equation Eq(2) may represent the values to be determined according to Equation Eq(2) in the characterization stage, for being used by the communications control circuit 114 at runtime when performing antenna tuning in the tuning stage. During performing the antenna tuning, the communications control circuit 114 may determine the load impedance $\Gamma_L$ according to the following equation:

$$(a * \Gamma_L) + (b * 1) - (c * \Gamma_{MRx} * \Gamma_L) = \Gamma_{MRx};$$

where the characterization values {a, b, c} in the above equation may be dependent upon the IMT setting IMT_setting(i) and the APT setting APT_setting(j), and therefore may be rewritten as the characterization values {a(i,j), b(i,j), c(i,j)}. For example, assuming that I=100 and J=18, the communications control circuit 114 may have obtained 1800 sets of characterization data (e.g., the characterization values {{a(i,j), b(i,j), c(i,j)}|i=1, . . . , 100; j=1, . . . , 18}, and may determine the load impedance according to the above equation at runtime, in order to determine the best setting according to the load impedance.

Theoretically, any two {$\Gamma_L(i,j)$} among {$\Gamma_L(i,j)$|i=1, . . . , I; j=1, . . . , J} may be equal to each other at runtime, which means $\Gamma_L$ will not change with respect to the settings at runtime. Therefore, the communications control circuit 114 may use a tuner setting to perform the $\Gamma_{MRx}$ measurement and use the characterization data of the setting to estimate $\Gamma_L$, and more particularly, use the estimated $\Gamma_L$ and the characterization data of different settings to estimate {RTG (i,j)}, respectively, and further execute argmax[RTG(i,j)] such as the function argmax[ ] that gives $i_{argmax}$ and $j_{argmax}$ (or the values of i and j to be found) which maximize RTG(i,j) in order to select the next best setting, where the associated details will be explained in some of the subsequent embodiments. As a result, the communications control circuit 114 can operate according to the best setting at any moment at runtime, in order to enhance the overall performance.

As shown in Equation Eq(2), the characterization value count of the characterization values {a, b, c} may be equal to three, and the reflection coefficient count of the reflection coefficients {$\Gamma_{L1}$, $\Gamma_{L2}$, . . . , $\Gamma_{L16}$} and the MRx-measured impedance parameter count of the MRx-measured impedance parameters {$\Gamma_{MRx1}$, $\Gamma_{MRx2}$, . . . , $\Gamma_{MRx16}$} (as well as the OSL calibration kit setting count of the predetermined OSL calibration kit) may be equal to 16, but the present invention is not limited thereto. According to some embodiments, the characterization value count, the reflection coefficient count, the MRx-measured impedance parameter count and the OSL calibration kit setting count may vary. For example, the characterization values {a, b, c}, the reflection coefficients {$\Gamma_{L1}$, $\Gamma_{L2}$, . . . , $\Gamma_{L16}$} and the MRx-measured impedance parameters {$\Gamma_{MRx1}$, $\Gamma_{MRx2}$, . . . , $\Gamma_{MRx16}$} in Equation Eq(2) may be replaced with U characterization values {$a_1$, $a_2$, . . . , $a_U$}, V reflection coefficients {$\Gamma_{L1}$, $\Gamma_{L2}$, . . . , $\Gamma_{L(V)}$} and V MRx-measured impedance parameters {$\Gamma_{MRx1}$, $\Gamma_{MRx2}$, . . . , $\Gamma_{MRx(v)}$}, respectively. In addition, the V reflection coefficients $\Gamma_{L1}$, $\Gamma_{L2}$ . . . and $\Gamma_{L(V)}$ may represent the reference impedances (which may be known values) of the predetermined OSL calibration kit with the predetermined open setting, the predetermined short setting and (V−2) other settings (e.g., the first load setting and (V−3) additional load settings), respectively. For brevity, similar descriptions for these embodiments are not repeated in detail here.

FIG. 3 illustrates a second APT-HW-included calibration control scheme of the method according to an embodiment of the present invention. In comparison with the first APT-HW-included calibration control scheme shown in FIG. 2, the communications control circuit 114 may further comprise an APT 312, and all of the APT(s) such as the APTs 212 and 312 in addition to all of the IMT(s) such as the IMT 211 may be included in the impedance-related tuning components to be processed with the OSL calibration. For brevity, similar descriptions for this embodiment are not repeated in detail here.

FIG. 4 illustrates a third APT-HW-included calibration control scheme of the method according to an embodiment of the present invention. In comparison with the first APT-HW-included calibration control scheme shown in FIG. 2, the communications control circuit 114 may comprise an APT 412 that is electrically connected to the antenna (ANT) via a non-feed point (or a point differing from the feed point) of the antenna, and all of the APT(s) such as the APT 412 in addition to all of the IMT(s) such as the IMT 211 may be included in the impedance-related tuning components to be processed with the OSL calibration, where the OSL calibration plane (or the connection point of the predetermined OSL calibration kit) may pass through the antenna (ANT). For brevity, similar descriptions for this embodiment are not repeated in detail here.

FIG. 5 illustrates a fourth APT-HW-included calibration control scheme of the method according to an embodiment of the present invention. In comparison with the first APT-HW-included calibration control scheme shown in FIG. 2, the communications control circuit 114 may comprise the APTs 312 and 412, and all of the APT(s) such as the APTs 312 and 412 in addition to all of the IMT(s) such as the IMT 211 may be included in the impedance-related tuning components to be processed with the OSL calibration, where the OSL calibration plane (or the connection point of the predetermined OSL calibration kit) may pass through the antenna (ANT). For brevity, similar descriptions for this embodiment are not repeated in detail here.

FIG. 6 illustrates some implementation details of the connections between the antenna (labeled "ANT" for brevity) and some components such as the IMT 211 and the APTs 212 and 412 according to an embodiment of the present invention, but the present invention is not limited thereto. As shown in FIG. 6, the APT 412 may be electrically connected to the antenna via the non-feed point such as the point differing from the feed point of the antenna, and the other components such as the IMT 211 and the APT 212 may be electrically connected to the antenna via the feed point of the antenna. For brevity, similar descriptions for this embodiment are not repeated in detail here.

In the embodiment shown in FIG. 6, the other components mentioned above may comprise the IMT 211 and the APT 212, but the present invention is not limited thereto. According to some embodiments, the communications control circuit 114 may comprise the APT 312, and the APT 312 may be electrically connected to the antenna via the feed point of the antenna. For brevity, similar descriptions for these embodiments are not repeated in detail here.

FIG. 7 illustrates some implementation details of an IMT 511 according to an embodiment of the present invention. The IMT 511 may comprise at least one inductor such as the inductors $L_1$, $L_2$ and $L_3$, at least one capacitor such as the tunable capacitors $C_1$ and $C_2$, and at least one switch such as the switches coupled between the associated nodes as shown in FIG. 7, where the IMT 511 may be taken as an example of the IMT 211, but the present invention is not limited thereto. According to some embodiments, the architecture of the IMT 511, the aforementioned at least one inductor, the inductor count of the aforementioned at least one inductor, the aforementioned at least one capacitor, the capacitor count of the aforementioned at least one capacitor, the aforementioned at least one switch, the switch count of the aforementioned at least one switch, and/or the associated connections of the internal components of the IMT 511 may vary.

FIG. 8 illustrates some implementation details of an APT 512 according to an embodiment of the present invention. The APT 512 comprise at least one inductor such as the inductors $L_6$ and $L_7$, at least one capacitor such as the capacitor $C_6$, and at least one switch such as the switch coupled between the associated nodes as shown in FIG. 8, where the APT 512 may be taken as an example of any APT among the APTs 212, 312 and 412, but the present invention is not limited thereto. According to some embodiments, the architecture of the APT 512, the aforementioned at least one inductor, the inductor count of the aforementioned at least one inductor, the aforementioned at least one capacitor, the capacitor count of the aforementioned at least one capacitor, the aforementioned at least one switch, the switch count of the aforementioned at least one switch, and/or the associated connections of the internal components of the APT 512 may vary. According to some embodiments, the aforementioned at least one capacitor may be implemented by way of tunable capacitor.

FIG. 9 illustrates an internal-calibration-kit-based control scheme of the method according to an embodiment of the present invention. Based on the internal-calibration-kit-based control scheme, the communications control circuit 114 may comprise an internal OSL calibration kit, such as an OSL calibration kit 601 (labeled "O/S/L" in FIG. 9 for brevity) integrated into an impedance-related tuning component among all of the impedance-related tuning components within the communications control circuit 114. For better comprehension, taking the architecture shown in the lower half part of FIG. 2 as an example, the internal OSL calibration kit may be illustrated as the OSL calibration kit 601 integrated into the APT 212, which may be referred to as the APT 612 to emphasize that the OSL calibration kit 601 is integrated therein, but the present invention is not limited thereto. For another example, the internal OSL calibration kit may be illustrated as the OSL calibration kit 601 integrated into any IMT among the IMT(s) (e.g., the IMT 211) within the communications control circuit 114. In some examples, the internal OSL calibration kit may be illustrated as the OSL calibration kit 601 integrated into any APT among the APT(s) (e.g., the APTs 212, 312 and/or 412) within the communications control circuit 114. For brevity, similar descriptions for this embodiment are not repeated in detail here.

FIG. 10 illustrates an external-calibration-kit-based control scheme of the method according to an embodiment of the present invention. Based on the external-calibration-kit-based control scheme, the communications control circuit 114 may be selectively coupled to an external OSL calibration kit, such as an OSL calibration kit 602 (labeled "O/S/L" in FIG. 10 for brevity) for being selectively connected to the impedance-related tuning components within the communications control circuit 114. For brevity, similar descriptions for this embodiment are not repeated in detail here.

FIG. 11 illustrates a working flow of the method regarding the characterization stage according to an embodiment of the present invention. The communications control circuit 114 may execute the calibration flow such as the working flow shown in FIG. 11 with joint APT and IMT considerations (e.g., the joint consideration of the APT(s) such as the APTs 212, 312 and/or 412 and the IMT(s) such as the IMT 211 within the communications control circuit 114) for establishing the predetermined characterization data in the storage device 116, for being used in the tuning stage.

In Step S10, the wireless transceiver device 110 may utilize the communications control circuit 114 to select a calibration plane that can include the characterization of the IMT(s) such as the IMT 211 and the APT(s) such as the APTs 212, 312 and/or 412 within the communications control circuit 114.

In Step S11, the wireless transceiver device 110 may utilize the communications control circuit 114 to determine whether the communications control circuit 114 has been arranged to adopt one or more built-in calibration kits such as one or more internal OSL calibration kits. If Yes (e.g., the internal OSL calibration kit such as the OSL calibration kit 601 is adopted), Step S21 is entered; if No (e.g., the external OSL calibration kits such as the OSL calibration kit 602 is adopted), Step S22 is entered.

In Step S21, the wireless transceiver device 110 may utilize the communications control circuit 114 to estimate the $\Gamma_{MRx}$ values with the built-in kit(s) set as at least three different settings (e.g., the predetermined open setting, the predetermined short setting and the (V−2) other settings such as the (16−2) other settings, of the internal OSL calibration kit such as the OSL calibration kit 601).

In Step S22, the wireless transceiver device 110 may utilize the communications control circuit 114 to estimate the $\Gamma_{MRx}$ values when connecting to the external OSL calibration kits such as the OSL calibration kit 602 with at least three different impedances. For example, the OSL calibration kit 602 may be implemented by way of the simple OSL calibration kit with the open setting, the short setting and the load setting, and the aforementioned at least three different impedances may comprise the reference impedances of the OSL calibration kit 602 with the open setting, the short setting and the load setting, respectively. For another example, the OSL calibration kit 602 may be implemented by way of the predetermined OSL calibration kit with the predetermined open setting, the predetermined short setting and the (V−2) other settings such as the (16−2)

other settings, and the aforementioned at least three different impedances may comprise the reference impedances of the OSL calibration kit 602 with the predetermined open setting, the predetermined short setting and the (V−2) other settings such as the (16-2) other settings, respectively.

In Step S31, the wireless transceiver device 110 may utilize the communications control circuit 114 to calculate at least a portion of the predetermined characterization data, such as the S-parameters (e.g., $S_{XY}=f_{XY}(a,b,c)$ which is the function $f_{XY}$ of the characterization values {a, b, c} in Equation Eq(2)) or other equivalent characterization data (e.g., $S_{XY}=f_{XY}'(a,b,c)$ which is another function $f_{XY}'$ of the characterization values {a, b, c} in Equation Eq(2)), by the $\Gamma_{MRx}$ values (e.g., the V MRx-measured impedance parameters {$\Gamma_{MRx1}$, $\Gamma_{MRx2}$, . . . , $\Gamma_{MRx(V)}$} such as the MRx-measured impedance parameters {$\Gamma_{MRx1}$, $\Gamma_{MRx2}$, . . . , $\Gamma_{MRx16}$} in Equation Eq(2)) and the predefined reference Γvalues (e.g., the V reflection coefficients {$\Gamma_{L1}$, $\Gamma_{L2}$, . . . , $\Gamma_{L(V)}$} such as the reflection coefficients $\Gamma_{L1}$, $\Gamma_{L2}$ and $\Gamma_{L3}$) of the build-in kit settings (or the settings of the built-in calibration kits).

In Step S32, the wireless transceiver device 110 may utilize the communications control circuit 114 to calculate at least a portion of the predetermined characterization data, such as the S-parameters (e.g., $S_{XY}=f_{XY}(a,b,c)$ which is the function $f_{XY}$ of the characterization values {a, b, c} in Equation Eq(2)) or other equivalent characterization data (e.g., $S_{XY}=f_{XY}'(a,b,c)$ which is the other function $f_{XY}'$ of the characterization values {a, b, c} in Equation Eq(2)), by the $\Gamma_{MRX}$ values (e.g., the V MRx-measured impedance parameters {$\Gamma_{MRx1}$, $\Gamma_{MRx2}$, . . . , $\Gamma_{MRx(V)}$} such as the MRx-measured impedance parameters {$\Gamma_{MRx1}$, $\Gamma_{MRx2}$, . . . , $\Gamma_{MRx16}$} in Equation Eq(2)) and the predefined reference Γvalues (e.g., the V reflection coefficients {$\Gamma_{L1}$, $\Gamma_{L2}$, . . . , $\Gamma_{L(V)}$} such as the reflection coefficients $\Gamma_{L1}$, $\Gamma_{L2}$ and $\Gamma_{L3}$) of the external OSL calibration kits.

In Step S40, the wireless transceiver device 110 may utilize the communications control circuit 114 to repeat the $\Gamma_{MRX}$ estimation and S-parameter calculation flows (e.g., a first partial working flow comprising Steps S21 and S31, or a second partial working flow comprising Steps S22 and S32, depending on the determination result of Step S11 as to whether the first partial working flow or the second partial working flow should be executed) for all combinations of IMT and APT settings of interest at all frequencies of interest. For example, the IMT settings of the IMT(s) (e.g., the IMT 211) within the communications control circuit 114 may comprise the I IMT settings {IMT_setting(i)|i=1, . . . , I} corresponding to the I candidate states of the IMT(s), the APT settings of the APT(s) (e.g., the APTs 212, 312 and/or 412) within the communications control circuit 114 may comprise the J APT settings {APT_setting(j)|j=1, . . . , J} corresponding to the J candidate states of the APT(s), and the aforementioned all combinations of IMT and APT settings of interest may comprise the (I*J) combinations of the I IMT settings {IMT_setting(i)|i=1, . . . , I} and the J APT settings {APT_setting(j)|j=1, . . . , J}. In addition, the aforementioned all frequencies of interest may comprise multiple predetermined frequencies such as K frequencies {Freq(k)|k=1, . . . , K}. As a result, there may be (I*J*K) combinations of the I IMT settings {IMT_setting(i)|i=1, . . . , I}, the J APT settings {APT_setting(j)|j=1, . . . , J} and the K frequencies {Freq(k)|k=1, . . . , K}. For brevity, similar descriptions for this embodiment are not repeated in detail here.

For better comprehension, the method may be illustrated with the working flow shown in FIG. 11, but the present invention is not limited thereto. According to some embodiments, one or more steps may be added, deleted, or changed in the working flow shown in FIG. 11. For example, the communications control circuit 114 may execute the first partial working flow comprising Steps S21 and S31 or the second partial working flow comprising Steps S22 and S32 repeatedly until the respective $\Gamma_{MRx}$ estimation and S-parameter calculation of the aforementioned all combinations of IMT and APT settings of interest at the aforementioned all frequencies of interest are completed, as a replacement of Step S40. More particularly, in response to the determination result "Yes" of Step S11, the communications control circuit 114 may execute the first partial working flow comprising Steps S21 and S31 (I*J*K) times for the (I*J*K) combinations of the I IMT settings {IMT_setting(i)|i=1, . . . , I}, the J APT settings {APT_setting(j)|j=1, . . . , J} and the K frequencies {Freq(k)|k=1, . . . , K}, respectively; and in response to the determination result "No" of Step S11, the communications control circuit 114 may execute the second partial working flow comprising Steps S22 and S32 (I*J*K) times for the (I*J*K) combinations of the I IMT settings {IMT_setting(i)|i=1, . . . , I}, the J APT settings {APT_setting(j)|j=1, . . . , J} and the K frequencies {Freq (k)|k=1, . . . , K}, respectively. For brevity, similar descriptions for these embodiments are not repeated in detail here.

According to some embodiments, the communications control circuit 114 may use the characterization values {a, b, c} as the other equivalent characterization data mentioned in any step among Steps S31 and S32 in the characterization stage, and perform the associated calculation of this step at runtime in the tuning stage. For brevity, similar descriptions for these embodiments are not repeated in detail here.

FIG. 12 illustrates an estimation control scheme of the method according to an embodiment of the present invention. For example, the combination of the aforementioned at least one IMT (e.g., the IMT(s) such as the IMT 211) and the aforementioned at least one APT (e.g., the APT(s) such as the APTs 212, 312 and/or 412) may be regarded as a joint tuner module such as an IMT and APT module (labeled "IMT & APT" for brevity) having multiple ports, and the multiple ports may comprise a port P1 connected to the source (or the signal source) and a port P2 connected to the load, where the source may represent the RFFE 210 when omitting the coupler 210c and the MRx 210r, and the load may represent the antenna (ANT). Regarding the S-parameters {$S_{XY}=f_{XY}(a,b,c)$} of the IMT and APT module, the "X" and the "Y" in the subscript "XY" of the symbol "$S_{XY}$" of the S-parameter $S_{XY}$ (or the symbol "$f_{XY}$" of the function) may indicate an out-port (or outward port) and an in-port (or inward port), respectively, and for a device under test (DUT) such as the IMT and APT module having the two ports P1 and P2, the respective output signals $OUT_1$ and $OUT_2$ of the ports P1 and P2 may be express with combinations of the respective input signals $IN_1$ and $IN_2$ of the ports P1 and P2 by using the S-parameters {$S_{XY}$} such as the S-parameters {$S_{11}$, $S_{12}$, $S_{21}$, $S_{22}$} as follows:

$$OUT_1 = (S_{11}*IN_1) + (S_{12}*IN_2); \text{ and}$$

$$OUT_2 = (S_{21}*IN_1) + (S_{22}*IN_2);$$

where the S-parameters {$S_{11}$, $S_{12}$, $S_{21}$, $S_{22}$} may be defined as follows:

$$S_{11} = (OUT_1/IN_1)|IN_2 = 0;$$

$$S_{12} = (OUT_1/IN_2)|IN_1 = 0;$$

$$S_{21} = (OUT_2/IN_1)|IN_2 = 0; \text{ and}$$

$$S_{22} = (OUT_2/IN_2)|IN_1 = 0.$$

For better comprehension, the S-parameters $S_{11}$, $S_{12}$, $S_{21}$ and $S_{22}$ may represent the input port voltage reflection coefficient, the reverse voltage gain, the forward voltage gain and the output port voltage reflection coefficient, respectively.

During the tuning stage, the communications control circuit 114 may perform joint APT and IMT CLAT at runtime in the tuning stage for performance optimization, and the associated operations in the tuning stage may comprise:

(1) the communications control circuit 114 may measure the load impedances $\{\Gamma_L(i,j)|i=1, \ldots, I; j=1, \ldots, J\}$, for example, according to the following equation:

$$(a(i,j)*\Gamma_L(i,j))+(b(i,j)*1)-(c(i,j)*\Gamma_{MRx}(i,j)*\Gamma_L(i,j))$$
$$=\Gamma_{MRx}(i,j)");$$

(2) the communications control circuit 114 may estimate the relative transducer gains (RTGs) of different IMT and APT settings (e.g., the (I*J) combinations of the I IMT settings $\{IMT\_setting(i)|i=1, \ldots, I\}$ and the J APT settings $\{APT\_setting(j)|j=1, \ldots, J\}$); and (3) the communications control circuit 114 may apply the setting with the highest estimated RTG, in order to achieve the best antenna efficiency;

where the communications control circuit 114 may perform the operations listed above repeatedly at runtime in the tuning stage to optimize the overall performance. More particularly, the communications control circuit 114 may estimate the RTGs of the aforementioned different IMT and APT settings by calculating the joint S-parameters $\{S_{XY}(i, j)=f_{XY}(a(i,j), b(i,j), c(i,j))|i=1, \ldots, I; j=1, \ldots, J\}$ (e.g., the joint S-parameters $\{S_{XY}(i,j,k)=f_{XY}(a(i,j,k), b(i,j,k), c(i,j,k))|i=1, \ldots, I; j=1, \ldots, J; k=1, \ldots, K\}$ for the K frequencies $\{Freq(k)| k=1, \ldots, K\}$) of the IMT and APT module and performing estimation of the load impedances $\{\Gamma_L(i,j)|i=1, \ldots, I; j=1, \ldots, J\}$(e.g., the load impedances $\{\Gamma_L(i,j,k)|i=1, \ldots, I; j=1, \ldots, J; k=1, \ldots, K\}$ for the K frequencies $\{Freq(k)|k=1, \ldots, K\}$), and the RTG may be estimated, for example, by:

$$\frac{|S_{21}|^2}{|1 - S_{22}\Gamma_L|^2}$$

where the load impedance $\Gamma_L$ may represent the estimation of the reflection coefficient of the load. The operation of estimating the RTG as shown above may be expressed with any of the following equations:

$$RTG(i, j) = (|S_{21}(i, j)|^2/|1(S_{22}(i, j)*\Gamma_L(i, j))|^2);$$

where "RTG(i,j)" may represent the RTG corresponding to the (I*J) combinations of the I IMT settings $\{IMT\_setting(i)|i=1, \ldots, I\}$ and the J APT settings $\{APT\_setting(j)|j=$ $1, \ldots, J\}$. When considering the aforementioned all frequencies of interest, the above equation may be written as follows:

$$RTG(i, j, k) = (|S_{21}(i, j, k)|^2/|1 - (S_{22}(i, j, k)*\Gamma_L(i, j, k))|^2);$$

where "RTG(i,j,k)" may represent the RTG corresponding to the (I*J*K) combinations of the I IMT settings $\{IMT\_setting(i)|i=1, \ldots, I\}$, the J APT settings $\{APT\_setting(j)|j=1, \ldots, J\}$ and the K frequencies $\{Freq(k)|k=1, \ldots, K\}$. For brevity, similar descriptions for this embodiment are not repeated in detail here.

FIG. 13 illustrates a working flow of the method regarding the tuning stage according to an embodiment of the present invention. The communications control circuit 114 may execute the working flow shown in FIG. 13 to adaptively perform antenna tuning with joint consideration of the aforementioned different types of impedance-related tuning components (e.g., the aforementioned at least one APT and the aforementioned at least one IMT), and more particularly, perform the CLAT with joint optimization of the APT and IMT settings, in order to improve antenna efficiency and therefore improve the system performance.

In Step S60, the wireless transceiver device 110 may utilize the communications control circuit 114 to obtain the predetermined characterization data of the aforementioned at least one impedance-related tuning component regarding the antenna tuning of the aforementioned at least one antenna of the communications control circuit 114 from the storage device 116.

In Step S61, the wireless transceiver device 110 may utilize the communications control circuit 114 to measure the aforementioned at least one VSWR (or "the VSWR(s)" for brevity) of the aforementioned any antenna among the aforementioned at least one antenna of the communications control circuit 114.

In Step S62, the wireless transceiver device 110 may utilize the communications control circuit 114 to determine the aforementioned at least one setting of the aforementioned at least one impedance-related tuning component according to the predetermined characterization data and the measured VSWR(s) (e.g., the VSWR(s) that have just been measured in Step S61), for the antenna performance optimization. For brevity, similar descriptions for this embodiment are not repeated in detail here.

For better comprehension, the method may be illustrated with the working flow shown in FIG. 13, but the present invention is not limited thereto. According to some embodiments, one or more steps may be added, deleted, or changed in the working flow shown in FIG. 13. For example, the wireless transceiver device 110 may utilize the communications control circuit 114 to measure the aforementioned at least one VSWR (e.g., the one or more VSWRs) such as multiple VSWRs of the aforementioned any antenna at multiple different frequencies $\{Freq(k)\}$ (e.g., at least two different frequencies Freq(k1) and Freq(k2) among the K frequencies $\{Freq(k)|k=1, \ldots, K\}$) in Step S61, and utilize the communications control circuit 114 to determine the aforementioned at least one setting of the aforementioned at least one impedance-related tuning component according to the predetermined characterization data and the measured VSWRs (e.g., the multiple VSWRs that have just been measured at the multiple different frequencies $\{Freq(k)\}$) in Step S62, for performing or completing the antenna performance optimization. In addition, in a situation where the wireless transceiver device 110 has obtained the predetermined characterization data from the storage device 116 in Step S60 and the predetermined characterization data is sufficient for performing the operation of Step 62 in the next iteration, the wireless transceiver device 110 may selectively skip re-entering Step S60 to directly execute the partial working flow comprising Steps S61 and S62 in the next iteration. For brevity, similar descriptions for these embodiments are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing antenna tuning control of a wireless transceiver device in a wireless communications system, the method comprising:

during a tuning stage among multiple stages, utilizing a communications control circuit within the wireless transceiver device to obtain predetermined characterization data of at least one impedance-related tuning component regarding antenna tuning of at least one antenna from a storage device within the wireless transceiver device, wherein the at least one impedance-related tuning component comprises at least one aperture tuner (APT), and the predetermined characterization data is determined in advance during a characterization stage among the multiple stages;

during the tuning stage, utilizing the communications control circuit to measure at least one voltage standing wave ratio (VSWR) of any antenna among the at least one antenna; and during the tuning stage, utilizing the communications control circuit to determine at least one setting of the at least one impedance-related tuning component according to the predetermined characterization data and the measured at least one VSWR, for antenna performance optimization;

wherein during the characterization stage, the communications control circuit is arranged to perform hardware characterization on the at least one impedance-related tuning component, in order to determine the predetermined characterization data, for being used in the tuning stage.

2. The method of claim 1, wherein the at least one impedance-related tuning component further comprises at least one impedance tuner (IMT).

3. The method of claim 1, wherein during the characterization stage, the communications control circuit is arranged to determine the predetermined characterization data according to a calibration flow for closed-loop antenna tuning (CLAT).

4. The method of claim 3, wherein the at least one impedance-related tuning component further comprises at least one impedance tuner (IMT); and during the characterization stage, the communications control circuit is arranged to determine the predetermined characterization data according to the calibration flow for the CLAT with joint characterization of the at least one APT and the at least one IMT.

5. The method of claim 1, wherein the at least one impedance-related tuning component comprises different types of impedance-related tuning components, and the at least one APT belongs to a first type among said different types of impedance-related tuning components.

6. The method of claim 5, wherein during the characterization stage, the communications control circuit is arranged to determine the predetermined characterization data according to a calibration flow for closed-loop antenna tuning (CLAT) with joint characterization of said different types of impedance-related tuning components.

7. The method of claim 5, wherein during the characterization stage, the communications control circuit is arranged to execute a calibration flow to perform the hardware characterization on said different types of impedance-related tuning components, in order to determine the predetermined characterization data, for being used in the tuning stage.

8. The method of claim 1, wherein a first APT among the at least one APT comprises a built-in calibration kit for providing reference impedances regarding at least three settings, respectively, wherein the at least three settings comprise an open setting, a short setting and at least one load setting; and during the characterization stage, the communications control circuit is arranged to determine the predetermined characterization data according to the reference impedances provided by the first APT.

9. A wireless transceiver device, for performing antenna tuning control of the wireless transceiver device in a wireless communications system, the wireless transceiver device being one of multiple devices within the wireless communications system, the wireless transceiver device comprising:

a processing circuit, arranged to control operations of the wireless transceiver device; and at least one communications control circuit, coupled to the processing circuit, arranged to perform communications control, wherein the at least one communications control circuit is arranged to perform wireless communications operations with a network within the wireless communications system for the wireless transceiver device;

wherein:

during a tuning stage among multiple stages, the wireless transceiver device is arranged to utilize the at least one communications control circuit to obtain predetermined characterization data of at least one impedance-related tuning component regarding antenna tuning of at least one antenna from a storage device within the wireless transceiver device, wherein the at least one impedance-related tuning component comprises at least one aperture tuner (APT), and the predetermined characterization data is determined in advance during a characterization stage among the multiple stages;

during the tuning stage, the wireless transceiver device is arranged to utilize the at least one communications control circuit to measure at least one voltage standing wave ratio (VSWR) of any antenna among the at least one antenna; and during the tuning stage, the wireless transceiver device is arranged to utilize the at least one communications control circuit to determine at least one setting of the at least one impedance-related tuning component according to the predetermined characterization data and the measured at least one VSWR, for antenna performance optimization;

wherein during the characterization stage, the at least one communications control circuit is arranged to perform hardware characterization on the at least one impedance-related tuning component, in order to determine the predetermined characterization data, for being used in the tuning stage.

10. The wireless transceiver device of claim 9, wherein a first APT among the at least one APT comprises a built-in calibration kit for providing reference impedances regarding at least three settings, respectively, wherein the at least three settings comprise an open setting, a short setting and at least one load setting; and during the characterization stage, the communications control circuit is arranged to determine the predetermined characterization data according to the reference impedances provided by the first APT.

* * * * *